United States Patent
Lee et al.

(10) Patent No.: US 7,558,114 B2
(45) Date of Patent: Jul. 7, 2009

(54) FLASH MEMORY DEVICE CAPABLE OF IMPROVING RELIABILITY

(75) Inventors: Jin-Wook Lee, Seoul (KR); Jin-Yub Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 157 days.

(21) Appl. No.: 11/454,481

(22) Filed: Jun. 16, 2006

(65) Prior Publication Data

US 2007/0091694 A1  Apr. 26, 2007

(30) Foreign Application Priority Data

Oct. 25, 2005  (KR) .................... 10-2005-0100815

(51) Int. Cl.
*G11C 16/26* (2006.01)
*G11C 16/08* (2006.01)
*G11C 16/06* (2006.01)

(52) U.S. Cl. ....................... 365/185.18; 365/185.11; 365/189.09; 365/230.03; 365/185.21

(58) Field of Classification Search ............ 365/185.11, 365/185.12, 185.18, 185.19, 185.22, 189.09, 365/230.03, 185.03, 185.17, 185.21; 711/147, 711/152, 153, 170, 173
See application file for complete search history.

(56) References Cited

U.S. PATENT DOCUMENTS

| | | | |
|---|---|---|---|
| 6,392,931 B1 * | 5/2002 | Pasotti et al. ........... | 365/185.19 |
| 6,496,409 B2 * | 12/2002 | Kobayashi et al. ..... | 365/185.03 |
| 6,529,418 B2 | 3/2003 | Nakai et al. | |
| 2002/0036930 A1 * | 3/2002 | Shibata et al. .............. | 365/195 |
| 2006/0044871 A1 * | 3/2006 | Tanikawa et al. ....... | 365/185.09 |

FOREIGN PATENT DOCUMENTS

JP  11283383  10/1999

(Continued)

OTHER PUBLICATIONS

A JPO computer translation of JP 11-283383.*
A JPO computer translation of JP 2000-173281 A.*
English Abstract for Publication No. 11-283383.

(Continued)

*Primary Examiner*—Jung H. Hur
(74) *Attorney, Agent, or Firm*—F. Chau & Assoc., LLC (57) ABSTRACT

A flash memory device includes a memory cell array having a first region and a second region that include memory cells arranged in a plurality of rows and columns; an address storage circuit adapted to store address information for defining the second region; a row decoder circuit adapted to select one of the first and second regions in response to an external address; a voltage generating circuit adapted to generate a read voltage to be provided to a row of the selected region by the row decoder circuit during a read operation; a detecting circuit adapted to detect whether the selected region is included in the second region on the basis of address information and external address information that are stored in the address storage circuit; and a control logic adapted to control the voltage generating circuit in response to an output of the detecting circuit during the read operation. The control logic controls the voltage generating circuit so that a read voltage provided to the row of the second region is lower than a read voltage provided to a row of the first region.

19 Claims, 6 Drawing Sheets

FOREIGN PATENT DOCUMENTS

| | | |
|---|---|---|
| JP | 11283384 | 10/1999 |
| JP | 2000173281 A * | 6/2000 |
| JP | 2002 288988 | 10/2002 |

OTHER PUBLICATIONS

English Abstract for Publication No. 11-283384.
English Abstract for Publication No. 2002-288988.

* cited by examiner

(PRIOR ART)

FLASH MEMORY DEVICE CAPABLE OF IMPROVING RELIABILITY

CROSS-REFERENCE TO RELATED PATENT APPLICATION

This application claims priority to Korean Patent Application No. 2005-100815, filed Oct. 25, 2005, the subject matter of which is hereby incorporated by reference in its entirety.

BACKGROUND OF THE INVENTION

1. Technical Field

The present disclosure is related to semiconductor memory devices. In particular, the disclosure is related to a phase change memory device and a program method thereof.

2. Discussion of Related Art

Electrically erasable and programmable semiconductor devices have been increasingly required without a refresh capability of the data stored therein. Presently, there is a trend to enhance capacitance and integrity of semiconductor devices. A typical example of a non-volatile memory device with large capacitance and high integrity without a refresh of stored data is a NAND flash memory. Even when the power supply is turned off, the NAND flash memories keep stored data. Accordingly, such flash memories are widely utilized in many electronic devices, such as portable terminals, portable computers, and so forth.

As shown in the following table 1, data retention characteristics and the number of program/erase cycles without deterioration are closely related with a reliability of the non-volatile memories having a floating gate structure. Stored charges in the form of electrons are driven from the floating gate by various failure mechanisms, thereby reducing a threshold voltage. In contrast, when a floating gate slowly obtains electrons under the condition that a control gate is maintained at a specific voltage, there is a reciprocal effect. As a result, a threshold voltage is increased. The repetition of program/erase cycles causes stress on an oxide layer of a cell transistor and also causes a failure, such as the deterioration of a tunnel oxide layer thereof. In flash memories, there is a problem of program/erase (PE) endurance because charges are trapped in the tunnel oxide layer during program/erase operations. Trapped charges affect a threshold voltage window of the memory devices and a program/erase time of the next cycle.

TABLE 1

|  | Code storage | Data storage |
| --- | --- | --- |
| PE cycle | 10K | 100K |
| Read cycle | 10E7 | 100K |
| Data cycle | 10 Year | 10 Year |

Figure 1:
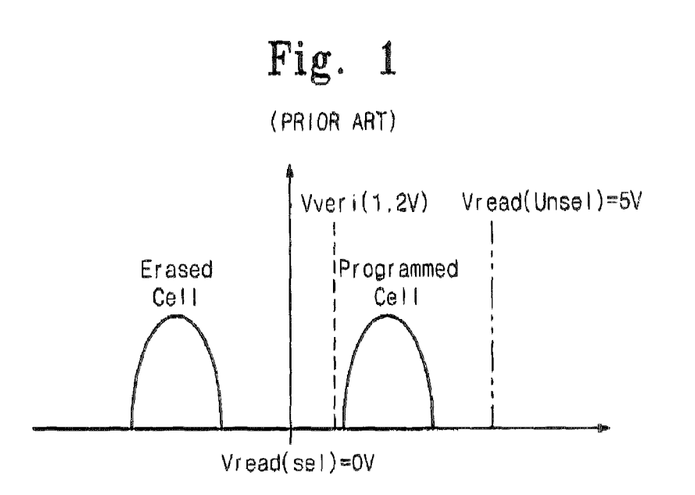
FIG. 1 shows threshold voltage distributions of erase/program memory cells.
Figure 2:
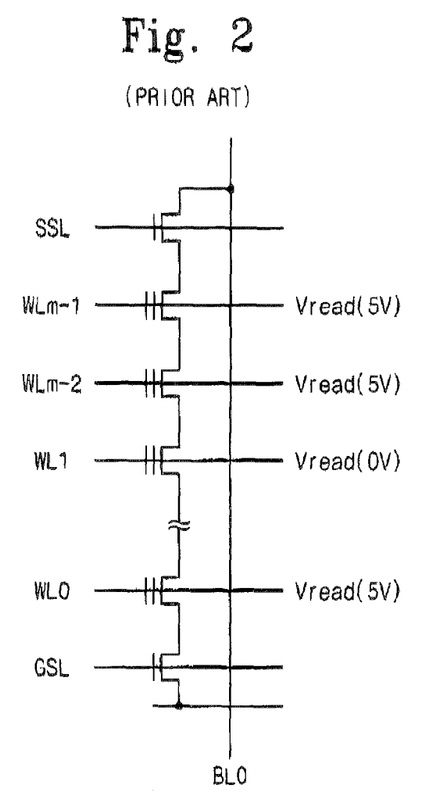
FIG. 2 shows a cell string structure of a conventional flash memory device.

Flash memories having a storage region for storing data, hereinafter, referred to as a "data storage region", and a region for storing a code (hereinafter, referred to as "code storage region") have been suggested. The data storage region and the code storage region have non-volatile memory cells, and each of the non-volatile memory cells has one of an erase state of data "1" and a program state of data "O". The threshold voltage distributions corresponding to the erase state and the program state are shown in FIG. 1. The threshold voltage of a memory cell having an erase status is lower than a reference voltage (e.g., 0V), and the threshold voltage of a memory cell having a program state is higher than a reference voltage (e.g., 0V). In NAND flash memories with a so-called string structure, as shown in FIG. 2, a read voltage Vread of 0V is applied to a word line (e.g. WL1) of a selected memory cell, and a read voltage Vread of 5V is applied to a word line (e.g. WL0, WL2~WLm−1) of non-selected memory cells. Non-volatile memory cells are programmed according to a repetition of program loops, and when program loops are repeated, a program voltage supplied to the word lines is stepwise increased by a predetermined increment. Bias conditions of the above-mentioned read and program operations are applied to the data storage region and the code storage region.

Figure 3:
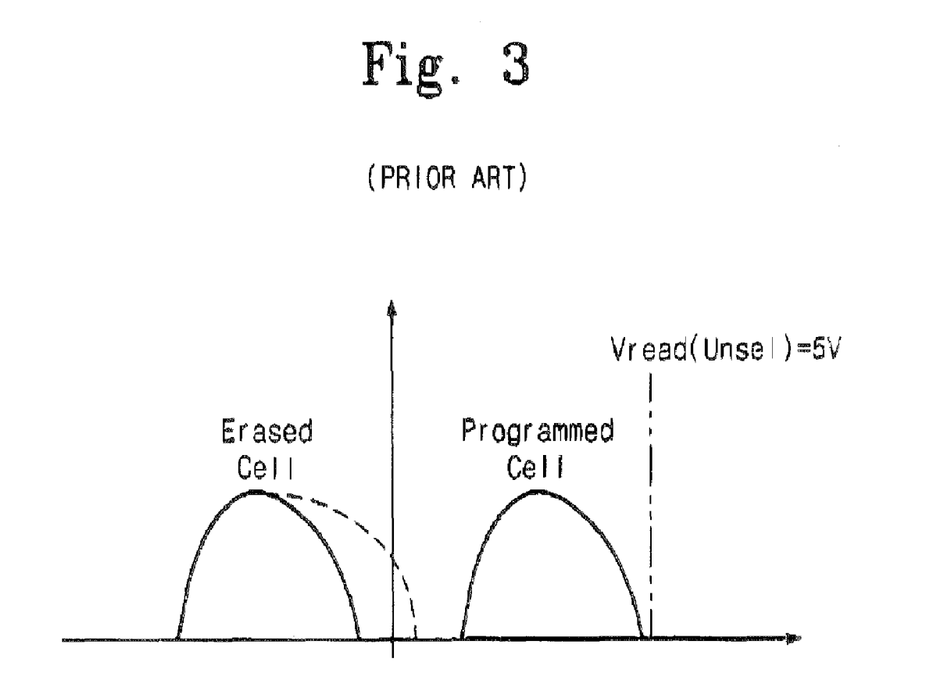
FIG. 3 illustrates read disturb occurring after program/erase cycles are performed.

As a read operation is repeated, the threshold voltage distribution of the erase memory cells is varied by a read voltage Vread applied to a non-selected word line. For instance, as shown in FIG. 3, the threshold voltage distribution of the eased memory cells is higher than the read voltage (Vread: 0V) applied to the selected word line after read operations are repeated. This is referred to as a "read disturb". Such a read disturb causes a read failure. In the event that this read failure happened in the code storage region, it is difficult to certify a code stored in the code storage region.

SUMMARY OF THE INVENTION

Embodiments of the invention provide a flash memory device capable of reducing a read disturb with respect to a code storage region.

Thus, in an exemplary embodiment, the invention provides a flash memory device comprising: a memory cell array having a first region and a second region that includes memory cells arranged in a plurality of rows and columns; an address storage circuit adapted to store address information for defining the second region; a row decoder circuit adapted to select one of the first and second regions in response to an external address; a voltage generating circuit adapted to generate a read voltage to be provided to a row of the selected region by the row decoder circuit during a read operation; a detecting circuit adapted to detect whether the selected region is included in the second region on the basis of address information and external address information that are stored in the address storage circuit; and a control logic adapted to control the voltage generating circuit in response to an output of the detecting circuit during the read operation, wherein the control logic controls the voltage generating circuit in order that a read voltage provided to the row of the second region is lower than a read voltage provided to a row of the first region.

Pursuant to this exemplary embodiment, the row receiving the read voltage is a non-selected row during the read operation.

In this exemplary embodiment, the control logic controls the voltage generating circuit so that the read voltage provided to the row of the second region is higher than the read voltage provided to the row of the first region.

According to this exemplary embodiment, the row receiving the read voltage is a selected row during the read operation.

In this exemplary embodiment, the first region is a data storage region, and the second region is a code storage region, and each of the first and second regions includes at least one memory block, and the memory block has cell strings corresponding to the rows.

Pursuant to this exemplary embodiment, the control logic controls the voltage generating circuit during the program operation so that a program voltage increment provided to the row of the second region is smaller than that provided to the row of the first region.

According to this exemplary embodiment, the control logic controls the voltage generating circuit during the program operation so that an initial program voltage of the program voltage provided to the row of the second region is higher than that of the program voltage provided to the row of the first region.

In this exemplary embodiment, the control logic controls the voltage generating circuit during the program operation so that a verification voltage provided to the row of the second region is higher than that provided to the row of the first region.

Pursuant to this exemplary embodiment, the control logic comprises: a program control unit controlling the voltage generating circuit in response to the output of the detecting circuit during a program operation; and a read control unit controlling the voltage generating circuit in response to the output of the detecting circuit during a read operation.

According to this exemplary embodiment, the program control unit comprises: a data program controller controlling the voltage generating circuit when the first region is selected; and a code program controller controlling the voltage generating circuit when the second region is selected.

In this exemplary embodiment, the read control unit comprises; a data read controller controlling the voltage generating circuit when the first region is selected; and a code read controller controlling the voltage generating circuit when the second region is selected.

Pursuant to this exemplary embodiment, the address information defining the second region is stored in the address storage circuit by an exterior during a power-up period.

According to this embodiment, the address information defining the second region is programmed in the address storage circuit in a wafer-level.

BRIEF DESCRIPTION OF THE DRAWINGS

Exemplary embodiments of the present invention can be understood in more detail from the following descriptions taken in conjunction with the attached drawings.

DESCRIPTION OF EXEMPLARY EMBODIMENTS

Figure 4:
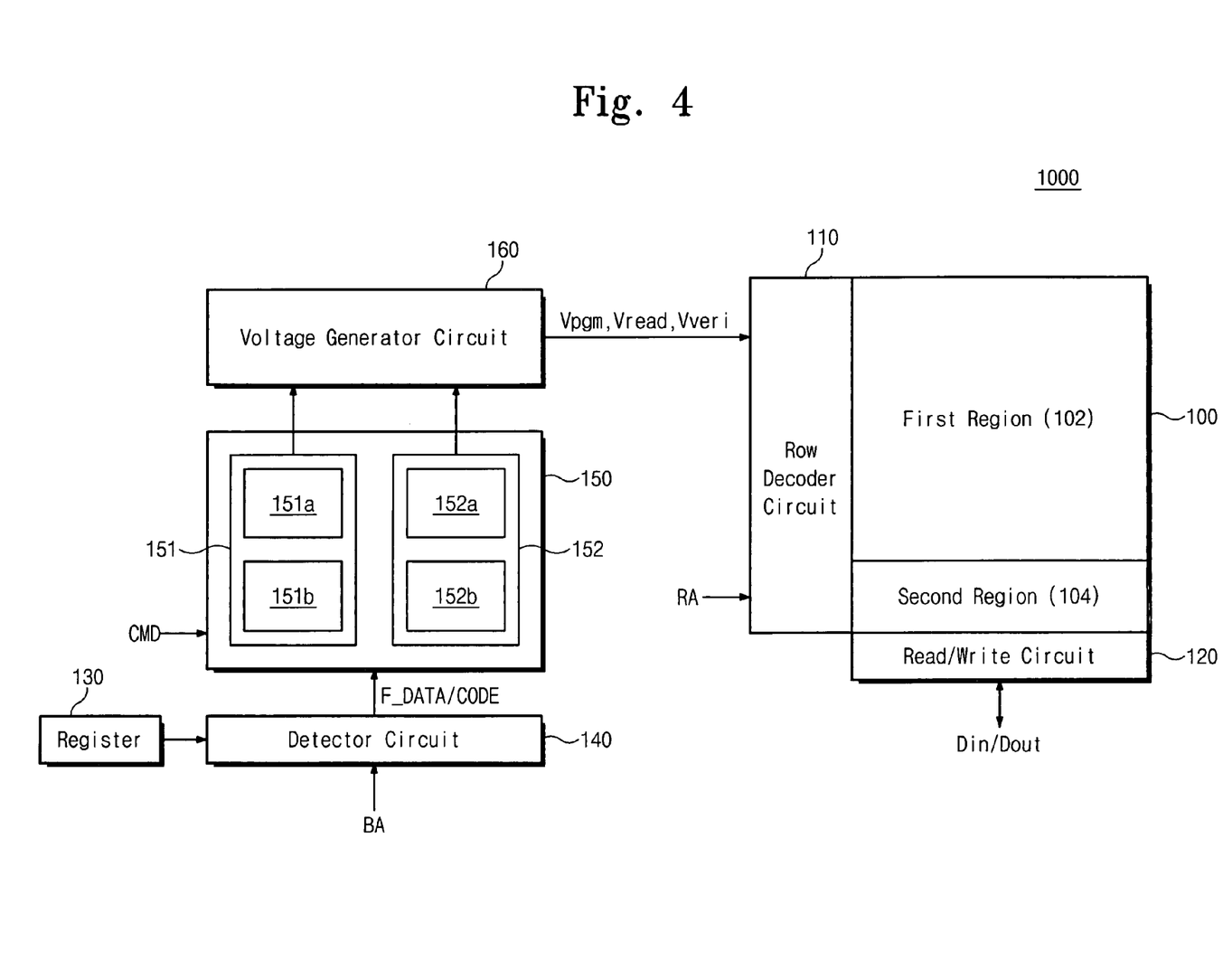
FIG. 4 is a block diagram of a flash memory device according to an embodiment of the present invention.

FIG. 4 is a block diagram of a flash memory device according to an embodiment of the present invention. As shown in FIG. 4, the flash memory device 1000 of the present invention includes a memory cell array 100 storing data information. The memory cell array 100 consists of first and second regions 102 and 104. The first region 102 is a data storage region for storing data, and the second region 104 is a code storage region for storing code. Each of the first and second regions 102 and 104 is formed of one or more memory blocks.

Figure 5:
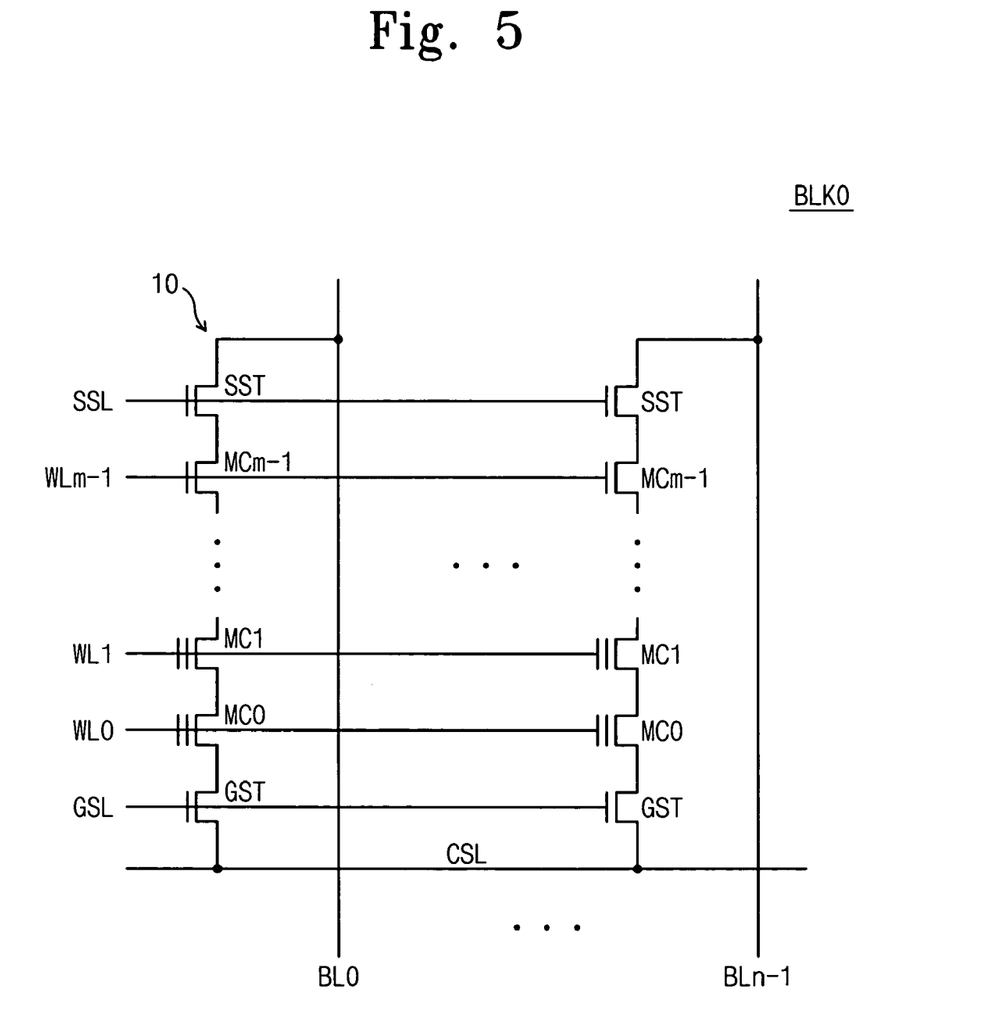
FIG. 5 is a circuit diagram of a memory block of a memory cell array shown in FIG. 4.

A memory block BLK of the memory cell array 100 is shown in FIG. 5 and includes a plurality of cell strings 10, referred to as a "NAND string", respectively corresponding to bit lines BL0~BLn−1. Each of the cell strings 10 consists of a string selection transistor SST as a first selection transistor, a ground selection transistor GST as a second selection transistor, and a plurality of memory cells MCm−1~MC0. The plurality of the memory cells MCm−1~MC0 are serially connected between the selection transistors SST and GST. The string selection transistor SST has a drain connected to a corresponding bit line and a gate connected to a string selection line SSL. The ground selection transistor GST has a source connected to a common source line CSL and a gate connected to a ground selection line GSL. Between the source of the string selection transistor SST and the drain of the ground selection transistor GSL, the memory cells MCm−1~MC0 are connected serially, and the memory cells are connected to corresponding word lines WL0~WL−1, respectively.

Referring to FIG. 4, a row decoder circuit 110 selects one of the memory blocks of the memory cell array 100 in response to a row address RA including a block address bit and a page address bit that are externally provided and then drives the word lines of selected memory blocks by a word line voltage from a voltage generating circuit 160. The selected memory block is included in the first region 102 or the second region 104. A read/write circuit 120 writes data in the selected memory block or reads data therefrom. The read/write circuit 120, although not shown in FIG. 5, includes a page buffer circuit, a column decoder circuit, a column gate circuit, a data input/output circuit and so forth, which are widely known to those skilled in the art.

A register 130 is an address storage circuit and stores block addresses for defining the second region 104 of the memory cell array 100. For example, the register 130 stores the block addresses for respectively selecting the first and last memory blocks among the plurality of memory blocks included in the second region 104. Block addresses may be stored in the register 130 using various techniques. For instance, block address information provided from a host may be stored in the register 130 at power-up. The register 130 may be constructed so that the block addresses for respectively selecting the first and second memory blocks of the second region 104 are programmed at a wafer level. A detector circuit 140 detects whether a memory block to be selected by a block address BA is included in the second region 104, that is, a code storage region, on the basis of block addresses stored in the register 130. The detector circuit 140 generates a flag signal F_DATA/CODE according to a detecting result. The flag signal F_DATA/CODE indicates whether a memory block to be selected is included in the second region 104, that is, a code storage region.

A control logic 150 controls a voltage generator circuit 160 in response to the flag signal F_DATA/CODE and a command signal CMD, which are provided from the detector circuit 140. More particularly, the control logic 150 controls the voltage generator circuit 160 so that program/read/verification voltages Vpgm/Vread/Vveri are generated differently according to whether a memory block to be selected is included in the second region 104 as a code storage region. The control logic 150 includes a program control unit 151 and a read control unit 152. The program control unit 151 is formed so as to control a program operation of the memory device 1000, in particular the voltage generating circuit 160 when a command signal CMD indicates a program operation and includes a data program controller 151a and a code program controller 151b. When the flag signal F_DATA/CODE indicates a selection of the data storage first region 102, the data program controller 151a is formed to control the voltage generator circuit 160 in response to the flag signal F_DATA/CODE and the command signal CMD. When the flag signal F_DATA/CODE indicates a selection of the code storage second region 104, the code program controller 151b is formed to control the voltage generator circuit 160 in response to the flag signal F_DATA/CODE and the command signal CDM.

Figure 6A:
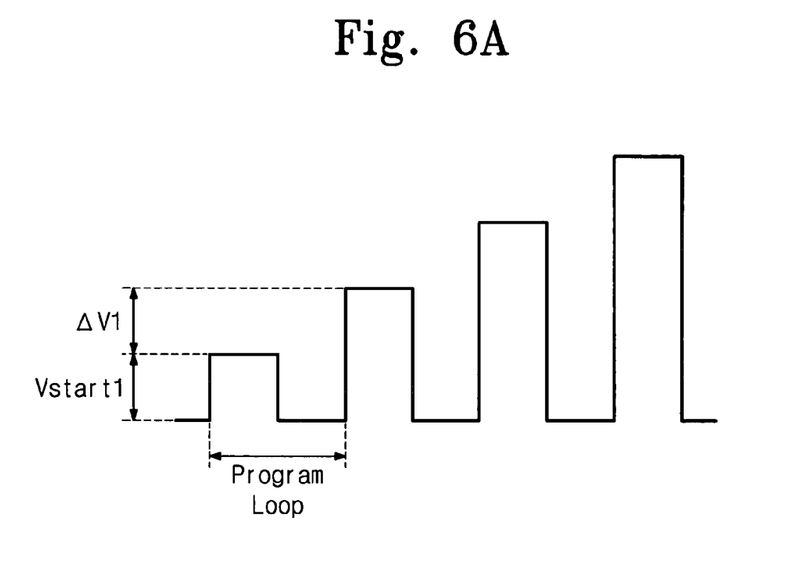
FIGS. 6A and 6B show a waveforms of program voltages applied to a code storage region and a data storage region during a program operation.
Figure 6B:
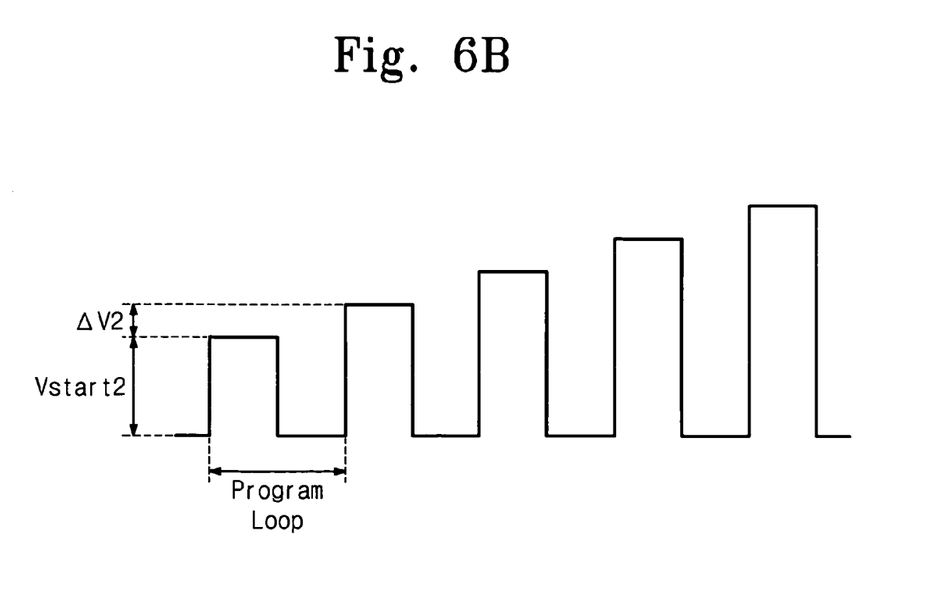

The program control unit 151 controls the voltage generating circuit 160 so that an increment of a program voltage and a program voltage, hereinafter, referred to as an "initial program voltage," of the first program loop are varied according to the selected storage region. As shown in FIGS. 6A and 6B, the program control unit 151 controls the voltage generator circuit 160 to set an increment, hereinafter referred to as a "first increment ($\Delta V1$)," during the program operation with respect the memory block of the first region 102 that is larger than an increment, hereinafter, referred to as a "second increment ($\Delta V2$)," during a program operation with respect to the memory block of the second region 104. In addition, the program control unit 151 controls the voltage generator circuit 160 to set an initial program voltage, hereinafter, referred to as a "first initial program voltage (Vstart1)," during the program operation with respect to the memory block of the first region 102 that is smaller than an initial program voltage, hereinafter referred to as a "second initial program voltage (Vstart2)," during the program operation with respect to the memory block of the second region 104. Under such program voltage control method, threshold voltage distributions of the programmed memory cells included in the code storage region 104 are narrower than the threshold voltage distributions of the programmed memory cells included in the data storage region 102.

Referring to FIG. 4, when the command signal CMD indicates a program operation, a read control unit 152 of the control logic 150 controls a read operation by controlling the voltage generator circuit 160. In addition, the read control unit 152 includes a data read controller 152a and a code read controller 152b. When the flag signal F_DATA/CODE indicates the selection of the data storage region 102, the data read controller 152a controls the voltage generator circuit 160 in response to the flag signal F_DATA/CODE and the command signal CDM. When the flag signal F_DATA/CODE indicates the selection of the code storage region 104, the code read controller 152b controls the voltage generator circuit 160 in response to the flag signal F_DATA/CODE and the command signal CMD. The read control unit 152 controls the voltage generator circuit 160 so that a read voltage Vread applied to a selected word line during a read operation with respect to the code storage region 104 is higher than a read voltage Vread applied to a selected word line during a read operation with respect to the data storage region 102. The read control unit 152 controls the voltage generator circuit 160 so that a read voltage Vread applied to a non-selected word line during a read operation with respect to the code storage region 104 is lower than a read voltage Vread applied to non-selected word line during a read operation with respect to the data storage region 102. In addition, the read control unit 152 controls the voltage generator circuit 160 so that a verify voltage (e.g., 1.4V) during a program operation with respect to a memory block of the second region 104 is higher than a verify voltage (e.g., 1.2V) during a program operation with respect to a memory block of the first region 102. According to this read method, it is possible to reduce a read disturb in the code storage region 104 by lowering the read voltage Vread applied to the non-selected word line.

Figure 7:
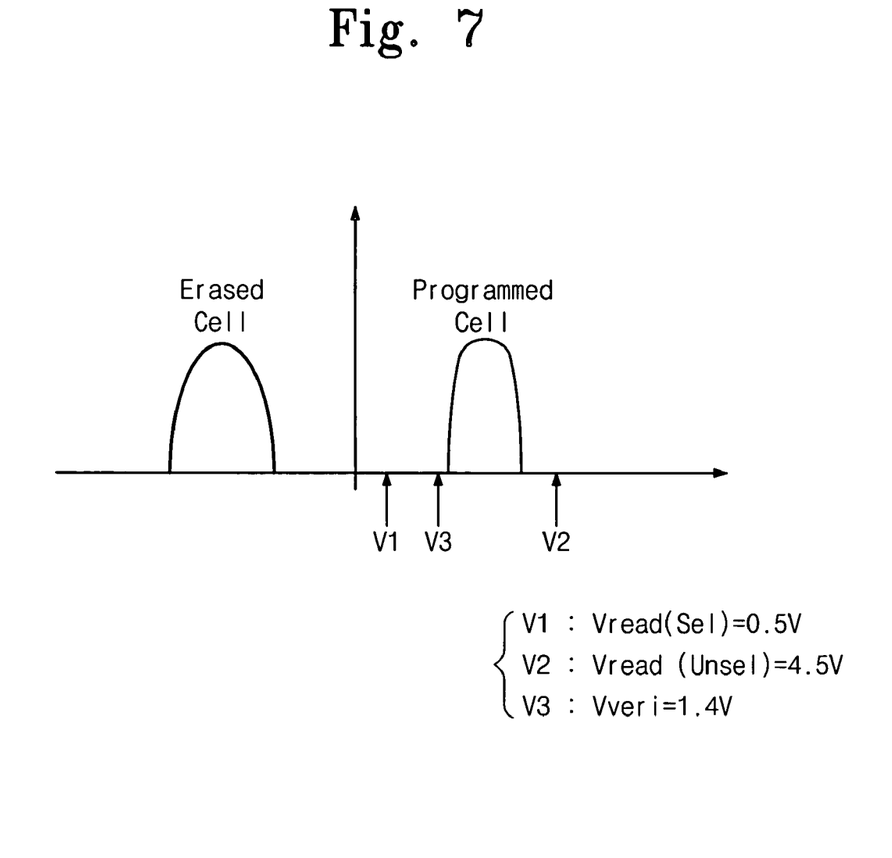
FIG. 7 shows a threshold voltage distribution of a code storage region of the flash memory device according to an embodiment of the present invention.

In the exemplary embodiment shown in FIG. 4, the voltage generator circuit 160 is controlled by the control logic 150 and generates a program voltage Vpgm, a read voltage Vread, and a verify voltage Vveri depending on an operation mode. As shown in FIGS. 6A and 6B, the program voltage Vpgm is generated to have a first initial program voltage Vstart1 during a program operation with respect to the data storage region 102, the program voltage Vpgm is generated to have a second initial program voltage Vstart2 during a program operation with respect to the code storage region 104. The first initial program voltage Vstart1 is lower than the second initial program voltage Vstart2. While the increment of a program voltage during a program operation with respect to the data storage region 102 is generated to have the first increment $\Delta V1$, the increment of a program voltage during a program operation with respect to the code storage region 104 is generated to have the second increment $\Delta V2$. The first increment $\Delta V1$ is larger than the second increment $\Delta V2$. Since a program voltage is increased as much as the second increment $\Delta V2$ but less than the first increment $\Delta V1$ during the program operation with respect to the code storage region 104, as shown in FIG. 7, the threshold voltage distribution of the programmed memory cells included in the code storage region 104 is narrower than the threshold voltage distribution of the programmed memory cells included in the data storage region 102. As shown in FIGS. 1 and 7, the verify voltage Vveri with respect to the code storage region 104 is set to be higher than the verify voltage Vveri with respect to the data storage region 102.

According to an exemplary embodiment of the present invention, a program/read/verify voltage that is supplied to the code storage region 104 is set to be different from that supplied to the data storage region 102 in order to reduce the so-called read disturb. More specifically, referring to FIG. 7, the threshold voltage distributions of the programmed memory cells are set to be narrow. Additionally, the read voltage applied to the non-selected word line of the code storage region 104 is set to be lower than the read voltage applied to the non-selected word line of the data storage region 102. In contrast, the read voltage applied to the selected word line of the code storage region 104 is set to be higher than the read voltage applied to the selected word line of the data storage region 102.

In the exemplary embodiment, the threshold voltage distributions of the programmed memory cells included in the code storage region 104 are narrower than those of the programmed memory cells included in the data storage region 102 and, thus, the read voltage applied to the non-selected word line is reduced. As a result, it is possible to reduce the so-called read disturb occurring in the code storage region.

This invention has been described using exemplary embodiments; however, it will be understood that the scope of the invention is not limited to only the described embodiments. Rather, the scope of the invention is intended to encompass various modifications and similar arrangements.

What is claimed is:

1. A flash memory device comprising:
   a memory cell array having a first region and a second region, each including memory cells arranged in a plurality of rows and columns and storing an identical number of bits per memory cell;
   an address storage circuit adapted to store address information defining the second region;
   a row decoder circuit adapted to select one of the first and second regions in response to an external address;

a voltage generator circuit generating a read voltage provided to a row of the first or second region selected by the row decoder circuit during a read operation;

a detector circuit adapted to detect whether the selected region is included in the second region based on the address information stored in the address storage circuit and on external address information; and a control logic adapted to control the voltage generator circuit in response to an output of the detector circuit during the read operation, wherein the control logic controls the voltage generator circuit so that a read voltage provided to a row of the second region is lower than a read voltage provided to a row of the first region.

2. The flash memory device of claim 1, wherein the row receiving the read voltage is a non-selected row during the read operation.

3. The flash memory device of claim 1, wherein the control logic controls the voltage generator circuit so that a second read voltage provided to the row of the second region is higher than a second read voltage provided to the row of the first region when the row receiving the second read voltage is a selected row during the read operation.

4. The flash memory device of claim 1, wherein the first region is a data storage region, and the second region is a code storage region.

5. The flash memory device of claim 1, wherein the control logic controls the voltage generator circuit so that a verification voltage provided to the row of the second region is higher than a verification voltage provided to the row of the first region.

6. The flash memory device of claim 1, wherein the control logic comprises:

a program control unit controlling the voltage generator circuit in response to the output of the detector circuit during a program operation; and a read control unit controlling the voltage generator circuit in response to the output of the detector circuit during the read operation.

7. The flash memory device of claim 6, wherein the program control unit comprises:

a data program controller controlling the voltage generator circuit when the first region is selected; and a code program controller controlling the voltage generator circuit when the second region is selected.

8. The flash memory device of claim 6, wherein the read controller unit comprises:

a data read controller controlling the voltage generator circuit when the first region is selected; and a code read controller controlling the voltage generator circuit when the second region is selected.

9. The flash memory device of claim 1, wherein the address information defining the second region is externally supplied and stored in the address storage circuit during a power-up period.

10. The flash memory device of claim 1, wherein the address information defining the second region is programmed in the address storage circuit in a wafer-level.

11. A flash memory device comprising:

a memory cell array having a first region and a second region, each including memory cells arranged in a plurality of rows and columns and storing an identical number of bits per memory cell;

an address storage circuit adapted to store address information defining the second region;

a row decoder circuit adapted to select one of the first and second regions in response to an external address;

a voltage generator circuit generating a read voltage provided to a row of the first or second region selected by the row decoder circuit during a read operation;

a detector circuit adapted to detect whether the selected region is included in the second region based on the address information stored in the address storage circuit and on external address information; and a control logic adapted to control the voltage generator circuit in response to an output of the detector circuit during the read operation, wherein the control logic controls the voltage generator circuit so that a read voltage provided to a row of the second region is lower than a read voltage provided to a row of the first region, wherein the row receiving the read voltage is a selected row during the read operation.

12. A flash memory device comprising:

a memory cell array having a first region and a second region, each including memory cells arranged in a plurality of rows and columns and storing an identical number of bits per memory cell;

an address storage circuit adapted to store address information defining the second region;

a row decoder circuit adapted to select one of the first and second regions in response to an external address;

a voltage generator circuit generating a read voltage provided to a row of the first or second region selected by the row decoder circuit during a read operation;

a detector circuit adapted to detect whether the selected region is included in the second region based on the address information stored in the address storage circuit and on external address information; and a control logic adapted to control the voltage generator circuit in response to an output of the detector circuit during the read operation, wherein the control logic controls the voltage generator circuit so that a read voltage provided to a row of the second region is lower than a read voltage provided to a row of the first region, wherein each of the first and second regions includes at least one memory block, and wherein the memory block has a plurality of transistor cell strings corresponding to the rows.

13. A flash memory device comprising:

a memory cell array having a first region and a second region, each including memory cells arranged in a plurality of rows and columns and storing an identical number of bits per memory cell;

an address storage circuit adapted to store address information defining the second region;

a row decoder circuit adapted to select one of the first and second regions in response to an external address;

a voltage generator circuit generating a read voltage provided to a row of the first or second region selected by the row decoder circuit during a read operation;

a detector circuit adapted to detect whether the selected region is included in the second region based on the address information stored in the address storage circuit and on external address information; and a control logic adapted to control the voltage generator circuit in response to an output of the detector circuit during the read operation, wherein the control logic controls the voltage generator circuit so that a read voltage provided to a row of the second region is lower than a read voltage provided to a row of the first region, wherein the control logic controls the voltage generator circuit during a program operation so that a program voltage increment provided to the row of the second region is smaller than a program voltage increment provided to the row of the first region.

14. The flash memory device of claim 13, wherein the control logic controls the voltage generator circuit during the program operation so that an initial program voltage of the program voltage provided to the row of the second region is higher than an initial program voltage of the program voltage provided to the row of the first region.

15. A method for operating a flash memory device including a memory cell array having a first region and a second region, each including memory cells arranged in a plurality of rows and columns and storing an identical number of bits per memory cell, comprising:
 executing a programming operation for the first region and/or the second region to store data, and
 executing a reading operation for the first region and/or the second region to read the stored data,
 wherein a read voltage provided to a row of the second region is lower than a read voltage provided to a row of the first region during the reading operation.

16. The method of claim 15, wherein the row receiving the read voltage is a non-selected row during the read operation.

17. The method of claim 15, wherein a program voltage increment provided to a row of the second region is lower than a program voltage increment provided to a row of the first region during the programming operation.

18. The method of claim 17, wherein an initial program voltage of the program voltage provided to the row of the second region is higher than an initial program voltage of the program voltage provided to the row of the first region during the programming operation.

19. The method of claim 15, wherein a verification voltage provided to a row of the second region is higher than a verification voltage provided to a row of the first region during the programming operation.

* * * * *